June 27, 1961 J. E. R. HARRISON ET AL 2,990,452
COMPOUND-CONNECTED TEMPERATURE-STABILIZED
TRANSISTOR AMPLIFIER CIRCUIT
Original Filed Feb. 8, 1957
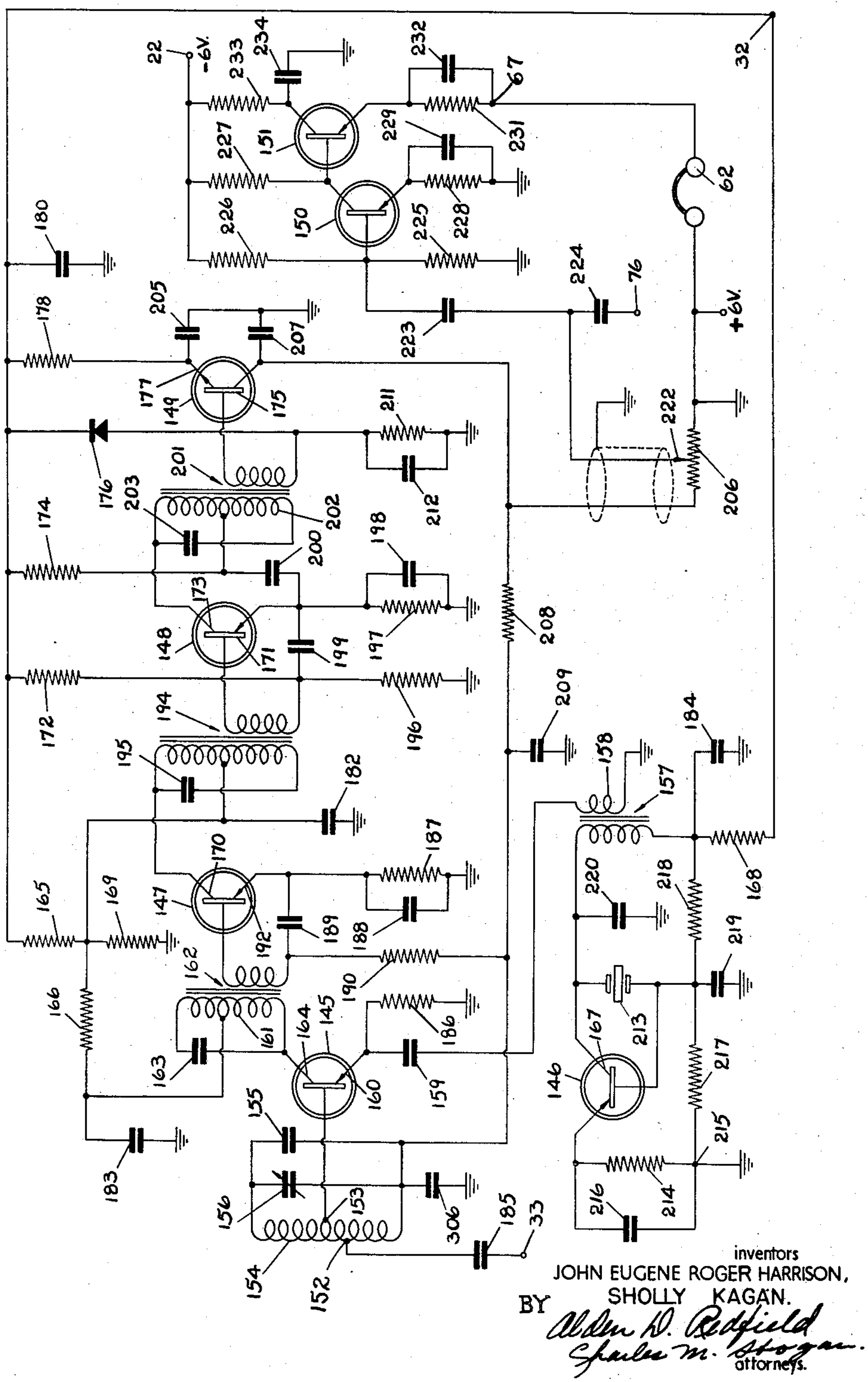
inventors
JOHN EUGENE ROGER HARRISON,
SHOLLY KAGAN.
BY Alden D. Redfield
Charles M. Hogan
attorneys.

United States Patent Office 2,990,452
Patented June 27, 1961

2,990,452

COMPONENT-CONNECTED TEMPERATURE-STABILIZED TRANSISTOR AMPLIFIER CIRCUIT

John Eugene Roger Harrison, Bedford, and Sholly Kagan, Newton Highlands, Mass., assignors to Avco Manufacturing Corporation, Cincinnati, Ohio, a corporation of Delaware Original application Feb. 8, 1957, Ser. No. 639,075. Divided and this application Feb. 5, 1958, Ser. No. 715,165
1 Claim. (Cl. 179—1)

The present invention relates to portable radio transmitting and receiving sets, and specifically to a novel transistorized communication set.

This application is a division of our application Serial No. 639,075, filed February 8, 1957, entitled "Transistorized Portable Communication Set," and assigned to the same assignee as the present application and invention. We claim the benefits of the filing date of such patent application. Patent application Serial No. 639,-075 issued as U.S. Patent 2,935,606 on May 3, 1960. Reference is made to that patent for a full description of the set, including battery connections.

The primary object of the present invention is to provide a novel combination of compound-connected transistors, temperature-stabilization means, and additional voltage divider biasing means.

For a better understanding of the present invention, together with other and further objects, advantages, and capabilities thereof, reference is made to the following description of the accompanying drawing, the single figure of which is a circuit schematic of the receiver.

The circuits of the receiver comprise a mixer stage (transistor 145), a crystal-controlled oscillator (transistor 146), two intermediate frequency stages in cascade (transistors 147 and 148), a detector stage (transistor 149), and two audio stages (transistors 150 and 151).

The antenna, as described in U.S.Patents 2,931,034 and 2,935,606, issued March 29 and May 3, 1960, respectively, is coupled via terminal 33 to an inductor-tap 152 in the tuned input circuit of mixer transistor 145 by a capacitor 185. This transistor is of the surface-barrier type, and carrier signals are applied to the base from a tap 153 on a tuned circuit comprising a parallel combination of inductor 154, capacitor 155 and capacitor 156. The input and local oscillator signals are mixed in the emitter diode, the local oscillations being applied to the emitter circuit through a transformer 157, the secondary 158 of which is connected in series with a capacitor 159 between emitter 160 and ground. The collector is tuned to the difference frequency, resulting from the mixing, by the primary 161 of transformer 162, the primary being paralleled by a capacitor 163.

Negative biasing potential is supplied from a low voltage negative terminal 32 to these components: collector 164 of surface-barrier transistor 145, via series resistors 165 and 166, resistor 169 being connected in shunt between ground and the junction of resistors 165 and 166; collector 167 of surface-barrier transistor 146, via series resistor 168; collector 170 of surface-barrier transistor 147, via resistor 165; base 171 of transistor 148, via resistor 172; collector 173 of surface-barrier transistor 148, via resistor 174; base 175 of transistor 149, via diode impedance 176; and emitter 177 of detector transistor 149, via resistor 178. It will be observed that, in the case of each surface-barrier transistor, the collector is reverse-biased—i.e., biased negatively. Suitable filter capacitors, connected in shunt to ground, are provided in this biasing network, as follows: capacitor 180, between low voltage terminal 32 and ground; capacitor 182, between ground and the junction of resistors 165 and 169; capacitor 183, between ground and that terminal of resistor 166 which is remote from terminal 32; and capacitor 184, between ground and that terminal of resistor 168 which is remote from terminal 32.

Continuing now with the description of the "front end" of the receiver, mixer transistor 145 is provided with a stabilizing resistor 186 between emitter and ground. Intermediate frequency signals are selected by the collector tank circuit of the mixer and applied, through transformer 162, to the input circuit or base of intermediate frequency transistor 147, which is connected in the common emitter configuration. A parallel combination of resistance 187 and capacitance 188 is inserted in the emitter lead of transistor 147. Resistance 187 stabilizes the circuit by compensating for temperature drift and variations among transistors. Capacitance 188 prevents degeneration and reduction in gain.

The series resistor 187 in the emitter leg counteracts a rise in collector current with temperature. Most of the collector current flows through resistor 187. The voltage drop across 187 tends to make the emitter 192 negative with respect to ground. The base is also negative with respect to ground, and the base-emitter voltage will be the difference between the AGC voltage applied from resistor 190 and the smaller voltage drop across resistance 187. Now, assuming a temperature-induced increment in collector current, the voltage drop across resistance 187 increases, making the emitter less positive relative to the base than it was before. This decrease in forward-biasing voltage of the base-emitter circuit results in less emitter current, thus causing a compensatory decrease in collector current. Resistor 186 performs a similar stabilizing function with transistor 145.

The first intermediate frequency stage is coupled to the second by a transformer 194, the primary of which is tuned by a capacitor 195 and the secondary of which has a lead connected to the base of transistor 148. This transistor is arranged in the common emitter configuration. The base is negatively biased relative to ground by connection in series with the junction of resistors 172 and 196 of a voltage divider. The emitter is less negatively biased relative to ground by resistor 197, bypassed by capacitor 198. This stage is stabilized by resistor 197. The second intermediate frequency stage is coupled to the detector by a transformer 201, the primary 202 of which is tuned by a capacitor 203 and the secondary of which has a lead connected to the base 175 of transisitor 149.

The detector is connected in the common emitter configuration, with signals applied to the base and the emitter grounded for audio frequency currents by capacitor 205. The collector load circuit comprises resistor 206, paralleled by a capacitor 207, each of those elements having a terminal connected to ground.

The detector transistor 149 is biased slightly in the forward direction by the voltage at the base 175 derived through resistor 211 and controlled by diode 176. As A.C. signal is applied through transformer 201, it is rectified in the base-emitter junction, and the derived bias alternately adds to the fixed bias and increases the current flow through the emitter and thus through the collector. As the current flow through the collector increases, so does the voltage across resistor 206. This increased voltage is used to bias the first transistors and produce an AGC (automatic gain control) action.

The audio component of the R.F. signal through transformer 201 is also impressed on transistor 149 through the base-emitter connection. The varying audio bias at the emitter-base junction causes varying current flow through the collector at an audio rate, and because of the transistor action amplification is obtained.

In this receiver the gain control is of the collector voltage control type. There is developed across resistor 206 the AGC voltage, applied, via resistors 208 and 190, to the base of first intermediate frequency amplifying transistor 147, and also applied, via resistor 208, to the base of mixer transistor 145. Filtering action is provided by shunt capacitor 209. As the received signal applied to the mixer input increases in amplitude, the AGC voltage becomes more negative, tending to increase the base and emitter current of transistors 145 and 147 with increasing input signal. This causes the voltage drop across the collector resistors 165, 166 and 169, respectively, to rise, reducing the collector voltage and gain of each stage.

The detector transistor 149 is temperature-stabilized. For that purpose diode 176 is connected, in its low resistance or conductive direction, effectively between base 175 and the negative terminal 32 of the source of biasing voltage. The return path to ground for diode 176 is completed by resistor 211, by-passed by capacitor 212. The collector of the NPN transistor 149 is biased in the reverse direction by connection to ground, the positive terminal of the low voltage source, via resistor 206. The base is made negative relative to the collector, but less negative than the emitter by reason of the network 176, 211, and 212. The operation of this circuit is such that, when an ambient temperature change tends to increase or decrease collector current, for example, the non-linear resistance or diode 176 responds to the temperature change in a compensatory fashion, rendering the base more negative (less conductive) or less negative (more conductive), respectively, so as to maintain collector current constant. The diode resistance decreases as temperature increases.

Referring now to the local oscillator, it is a transistorized Pierce type, with a tuned circuit equivalent or crystal 213 connected between collector and base of transistor 146. The emitter is biased in a positive direction relative to the base by connection of the resistor 214 to ground at 215, ground being the positive terminal of the low voltage source. Between this point and the negative terminal 32 is a voltage divider comprising resistors 217 and 218 and 168. The base is connected to the junction of resistors 217 and 218, rendering it negative relative to the emitter, and the collector is connected, through the primary inductance of transformer 157, to the junction of resistors 218 and 168, rendering the collector negative relative to the base and therefore biasing the collector circuit in the reverse direction. This oscillator circuit supplies the local oscillations to the mixer stage of the receiver.

Coming now to the audio system, sliding contact 222 on resistor 206 functions as the adjustable element of a volume control potentiometer and is coupled by series capacitor 223 and shunt resistor 225 to the base of transistor 150 of the first audio stage.

The collector of PNP transistor 150 is biased negatively (in reverse direction) relative to the base, by connections of collector and base to negative source terminal 22, via resistor 227 and higher-value resistor 226, respectively. The base is connected to the junction of resistors 225 and 226. Resistors 225 and 226 form a first voltage divider. Inserted in the emitter leg is a stabilizing resistor 228, by-passed by capacitor 229. Transistor 150 is referred to as a first PNP amplifier transistor having a first emitter, first collector, and first base. Elements 228, 229 form a first temperature-stabilization means. Resistor 227 and the emitter-collector circuit of transistor 150 and the first stabilization means 228, 229 form a second voltage divider. The emitter is less negative than the base, the drop across resistor 228 being less than the voltage applied to the base.

Transistor 150 is direct-coupled to the second PNP amplifier transistor 151, the collector of the former being connected to the base of the latter. The collector of transistor 151 is grounded (i.e., connected to a point of reference potential) by capacitor 234, and that transistor is connected in the common collector configuration. The output load (earphone 62) is in series with stabilizing resistor 231. The latter is by-passed by capacitor 232. Elements 231, 232 form a second temperature-stabilization means. The collector of PNP transistor 151 is biased negatively relative to the base by connections of collector and base to negative source terminal 22, via resistor 233 and higher-value resistor 227, respectively. Resistor 233 and capacitor 234 form a decoupling filter to prevent low frequency regeneration or "motorboating."

This audio system amplifies a relatively small audio signal (.03 VRMS) to produce full output with little distortion and also will produce relatively the same output with a usable distortion level when a signal of .20 VRMS is applied to the input. It also has almost constant amplification from −55° C. to +55° C.

In the operation of the receiver incoming signals from the antenna are selectively applied to mixer transistor 145 and are there heterodyned against local oscillations produced by the crystal-controlled oscillator circuitry, so that amplified carrier signals of intermediate frequency are applied to the intermediate frequency amplifying system comprising the cascaded transistors 147 and 148. The modulation components are derived in the detector stage comprising transistor 149, and the audio signals are amplified in the two-stage audio amplifying network comprising transistors 150 and 151.

The following circuit parameters are furnished by way of illustration and not limitation, and they have been found satisfactory in one successful embodiment of the invention:

Receiver parameters:

| | |
|---|---|
| Transistor 145 | Type SB100. |
| Transistor 147 | Type SB100. |
| Transistor 148 | Type SB100. |
| Transistor 149 | Type 2N147. |
| Transistor 150 | Type 2N185. |
| Transistor 151 | Type 2N185. |
| Transistor 146 | Type SB100. |
| Crystal 213 | Type CR18U. |
| Diode 176 | Type 32OG. |
| Capacitor 183 | 0.1 microfarad. |
| Capacitor 306 | 0.1 microfarad. |
| Capacitor 156 | Order of 400 microfarads. |
| Capacitor 155 | Temperature - compensating, 33 microfarads. |
| Capacitor 185 | 0.001 microfarad. |
| Capacitor 159 | 0.01 microfarad. |
| Capacitor 188 | 0.1 microfarad. |
| Capacitor 189 | 0.1 microfarad. |
| Capacitor 182 | 0.1 microfarad. |
| Capacitor 199 | 0.1 microfarad. |
| Capacitor 200 | 0.1 microfarad. |
| Capacitor 198 | 0.1 microfarad. |
| Capacitor 212 | 0.1 microfarad. |
| Capacitor 205 | 0.1 microfarad. |
| Capacitor 207 | 0.05 microfarad. |
| Capacitor 180 | 140 microfarads. |
| Capacitor 209 | 8 microfarads. |
| Capacitor 223 | 3 microfarads. |
| Capacitor 229 | 30 microfarads. |
| Capacitor 232 | 4 microfarads. |
| Capacitor 234 | 30 microfarads. |
| Capacitor 224 | 0.1 microfarad. |
| Capacitor 216 | 0.1 microfarad. |
| Capacitor 219 | 68 microfarads. |
| Capacitor 220 | 27 microfarads. |
| Capacitor 184 | 0.1 microfarad. |
| Resistor 166 | 1000 ohms. |
| Resistor 186 | 4700 ohms. |
| Resistor 165 | 1800 ohms. |
| Resistor 169 | 4700 ohms. |
| Resistor 190 | 1000 ohms. |
| Resistor 172 | 2200 ohms. |

Receiver parameters:

| | |
|---|---|
| Resistor **196** | 4700 ohms. |
| Resistor **174** | 1000 ohms. |
| Resistor **197** | 1000 ohms. |
| Resistor **178** | 100 ohms. |
| Resistor **211** | 39 ohms. |
| Resistor **225** | 3300 ohms. |
| Resistor **226** | 18,000 ohms. |
| Resistor **227** | 3300 ohms. |
| Resistor **228** | 1000 ohms. |
| Resistor **231** | 220 ohms. |
| Resistor **233** | 100 ohms. |
| Resistor having contact **222** | 10,000 ohms. |
| Resistor **214** | 4700 ohms. |
| Resistor **217** | 4700 ohms. |
| Resistor **218** | 4700 ohms. |
| Resistor **168** | 470 ohms. |
| Resistor **208** | 2200 ohms. |
| Resistor **187** | 390 ohms. |
| Coil **154** | R.F. input coil, tunes from 2–3.5 megacycles or 4–6 megacycles. |
| Earphone **62** | 300 ohms impedance earphone with 125 ohms D.C. resistance. |

While there has been shown and described what is at present considered to be the preferred embodiment of the invention, it will be understood by those skilled in the art that various modifications and changes and substitutions of equivalents may be made therein within the true scope of the invention as defined by the appended claim.

What is claimed is:

In a portable communications receiver, a two-stage direct coupled temperature-stabilized amplifying system comprising, in combination: a first PNP amplifier transistor having a first emitter, first collector and first base; a second PNP amplifier transistor having a second emitter, second collector and second base; a direct connection between said first collector and said second base; a source of bias currents having a positive terminal connected to a point of reference potential and also a negative terminal; three resistors, successively increasing in value, individually connected between said negative terminal and said second collector, second base and first base, respectively, for biasing said collectors negatively; a first voltage divider comprising, in series, the third of said resistors and a fourth resistor connected between the first base and said point of reference potential; a capacitor connected between the second collector and said point of reference potential; a first temperature-stabilization means comprising a first parallel combination of resistance and capacitance connected between said first emitter and said point of reference potential; a second temperature-stabilization means comprising a second parallel combination of resistance and capacitance; and headphones, said second temperature-stabilization means and headphones being connected in series circuit between said second emitter and said point of reference potential, the second of said resistors and the emitter-collector circuit of the first transistor and the first temperature-stabilization means being in series to form a second voltage divider.

References Cited in the file of this patent

UNITED STATES PATENTS

| | | |
|---|---|---|
| 1,545,040 | Dornig | July 7, 1925 |
| 1,857,137 | Byrnes | May 10, 1932 |
| 1,911,980 | Vance | May 30, 1933 |
| 2,240,715 | Percival | May 6, 1941 |
| 2,311,472 | Roosentein | Feb. 16, 1943 |
| 2,329,200 | Hefele | Sept. 14, 1943 |
| 2,384,263 | Schlesinger | Sept. 4, 1945 |
| 2,519,256 | Lee | Aug. 15, 1950 |
| 2,698,898 | Cooper | Jan. 4, 1955 |
| 2,711,513 | Baer | June 21, 1955 |
| 2,764,674 | Barton | Sept. 25, 1956 |
| 2,789,164 | Stanley | Apr. 16, 1957 |
| 2,794,076 | Shea | May 28, 1957 |
| 2,807,718 | Chressanthis | Sept. 24, 1957 |
| 2,811,646 | Yin | Oct. 29, 1957 |

FOREIGN PATENTS

| | | |
|---|---|---|
| 149,332 | Australia | Dec. 8, 1952 |

UNITED STATES PATENT OFFICE

CERTIFICATE OF CORRECTION

Patent No. 2,990,452 June 27, 1961

John Eugene Roger Harrison et al.

It is hereby certified that error appears in the above numbered patent requiring correction and that the said Letters Patent should read as corrected below.

In the heading to the printed specification, line 2, in the title of the invention, for "COMPONENT" read -- COMPOUND --; column 2, line 46, for "transisitor" read -- transistor --; column 4, lines 46 and 47, for "microfarads" read -- micro-microfarads --.

Signed and sealed this 5th day of December 1961.

(SEAL)
Attest:

ERNEST W. SWIDER
Attesting Officer

DAVID L. LADD
Commissioner of Patents

USCOMM-DC